Figure 1:
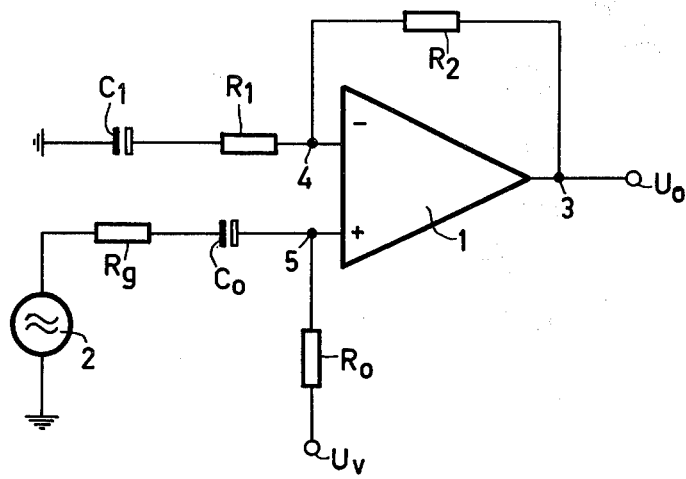

United States Patent [19]

Gottlieb et al.

[11] Patent Number: 4,462,000

[45] Date of Patent: Jul. 24, 1984

[54] AMPLIFIER COMPRISING MEANS FOR ELIMINATING DIRECT VOLTAGE TRANSIENTS ON THE AMPLIFIER OUTPUT

[75] Inventors: Detlef Gottlieb; Wolfgang Nolde, both of Hamburg, Fed. Rep. of Germany

[73] Assignee: U.S. Philips Corporation, New York, N.Y.

[21] Appl. No.: 338,715

[22] Filed: Jan. 11, 1982

[30] Foreign Application Priority Data

Apr. 6, 1981 [DE] Fed. Rep. of Germany ....... 3113824

[51] Int. Cl.³ ............................................. H03F 3/04
[52] U.S. Cl. ...................................... 330/51; 330/279
[58] Field of Search ................. 330/51, 207 P, 297, 330/298, 279; 455/174, 194, 212, 223

[56] References Cited

U.S. PATENT DOCUMENTS 3,889,202  6/1975  Suzuki ................................. 330/51

FOREIGN PATENT DOCUMENTS 53-122348 10/1978 Japan ................................. 330/51

Primary Examiner—James B. Mullins
Attorney, Agent, or Firm—Robert T. Mayer; Bernard Franzblau

[57] ABSTRACT

An amplifier comprising means for eliminating direct-voltage transients on the amplifier output includes a controllable voltage source, coupled to the output or to a point in the amplifier such that the output voltage gradually increases to the steady-state value. The magnitude of the output voltage of said source, which conducts current in one direction only, can be controlled by means of a control voltage which is continuously variable during the turn-on period and which is applied to its input. The voltage source is connected to the amplifier so that as the amplifier output voltage rises, it is cut off by the resulting potential changes.

19 Claims, 7 Drawing Figures

4,462,000

AMPLIFIER COMPRISING MEANS FOR ELIMINATING DIRECT VOLTAGE TRANSIENTS ON THE AMPLIFIER OUTPUT

This invention relates to an amplifier comprising means for eliminating direct voltage transients at the amplifier output when the power supply is switched on, which means comprises a voltage source which is coupled to the output or to a point in the amplifier in such a way that the output direct voltage gradually increases to the steady-state value during the turn-on period.

Such an amplifier is known from U.S. Pat. No. 3,781,699. Said amplifier comprises a differential amplifier stage having an inverting input connected to the output so as to constitute a negative-feedback loop. The amplifier's non-inverting input receives the input signal. The inverting input is connected to ground via an RC-network. A voltage source, which is constituted by a transistor whose base is connected to a constant voltage and whose emitter is coupled to the two inputs of the differential amplifier stage, ensures that the direct voltage at the inverting input increases more rapidly than that on the non-inverting input, so that the output voltage initially remains at zero. If subsequently the voltage at the non-inverting input reaches the value of that on the inverting input, the output voltage increases continuously to its steady-state value. However, the steady state is reached comparatively late, mainly because of the delayed rise of the output voltage.

However, in the known circuit arrangement the means for eliminating the direct voltage transients also influence the behaviour of the amplifier in the steady state. A further drawback of the known circuit arrangement is that between the inputs of the differential amplifier stage additional coupling resistors are needed in order to decouple the two inputs from each other. For a stronger decoupling said resistors should be of comparatively high value, which demands a substantial amount of space when the circuit is constructed as an integrated circuit. Moreover, under certain circumstances, the voltage source may clip the negative signal peaks in the case of comparatively large input signals.

It is an object of the present invention to construct a circuit arrangement of the type mentioned in the opening paragraph in such a way that at the amplifier output no direct voltage transients occur when the power supply is switched on. According to the invention this is achieved in that the magnitude of the output voltage of the voltage source, which conducts current in one direction only, can be controlled by means of a control voltage which is applied to its input and which varies continuously during the turn-on period, and in that the voltage source is connected to the amplifier in such a way that the voltage source is cut off by the potential change produced as the amplifier output voltage rises.

The voltage supplied by the voltage source varies in conformity with the control voltage, which varies continuously during the turn-on period. The output voltage and other potentials in the amplifier vary with said control voltage so that the voltage source, which can conduct current in one direction only, is cut off. As is known, any voltage source formed by means of transistors whose emitters constitute the circuit output has the property that it no longer conducts, or that its output is cut off, when the emitter potential becomes lower than or higher than a specific value relative to the base potential. In accordance with the invention the changing potentials in the amplifier are utilized for cutting off or switching off the voltage source, which is necessary in order to prevent the occurrence of signal distortion or a short-circuit by the low-ohmic voltage source during amplifier operation.

In principle, the voltage source may be connected directly to the amplifier output. However, in that case it will have to handle a comparatively large current during turn-on. A more favourable situation is obtained in the case of an amplifier which includes a driver stage preceding its power stage in that, in accordance with an embodiment of the invention, the voltage source is coupled to the driver stage in such a way that the drive current is at least partly drained via said source.

In a further embodiment of the invention, which is based on an amplifier in which d.c. negative feedback from the amplifier output to an inverting input of the amplifier is provided, which via an RC network is connected to a point of constant potential, the current drained via the voltage source is applied to the RC-network in such a way that the steady-state value of the output voltage is reached faster by more rapidly charging the capacitor of the RC-network. The current drained by the voltage source during the turn-on period is thus utilized for charging the RC-network more rapidly so that the output voltage reaches its steady-state value more rapidly.

Figure 2A:
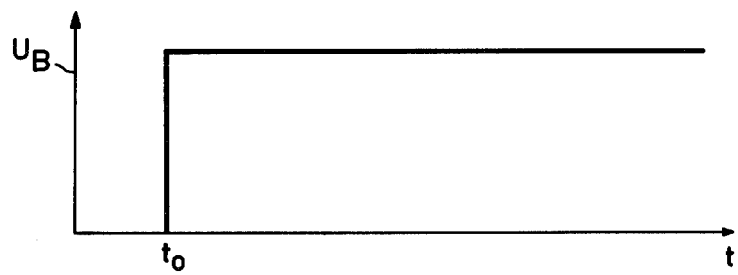
Figure 2B:
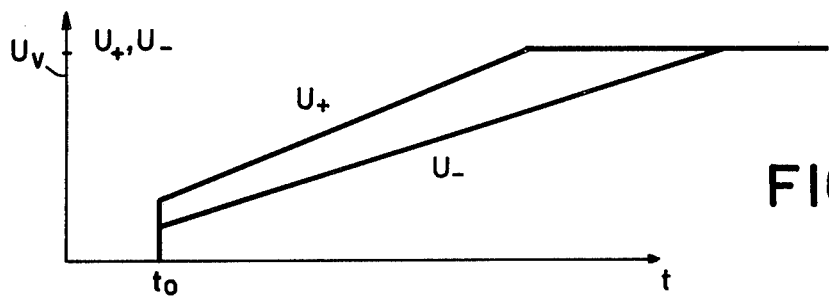
Figure 2C:
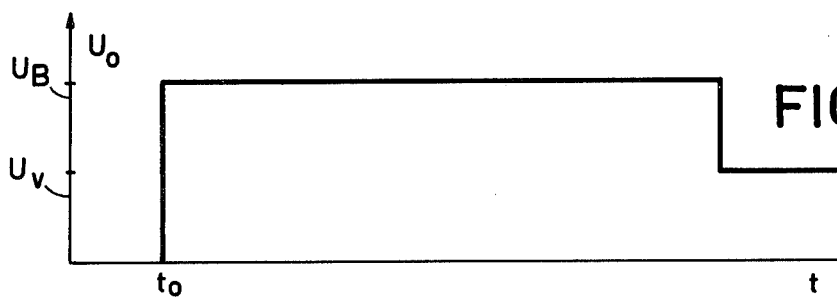
Figure 3:
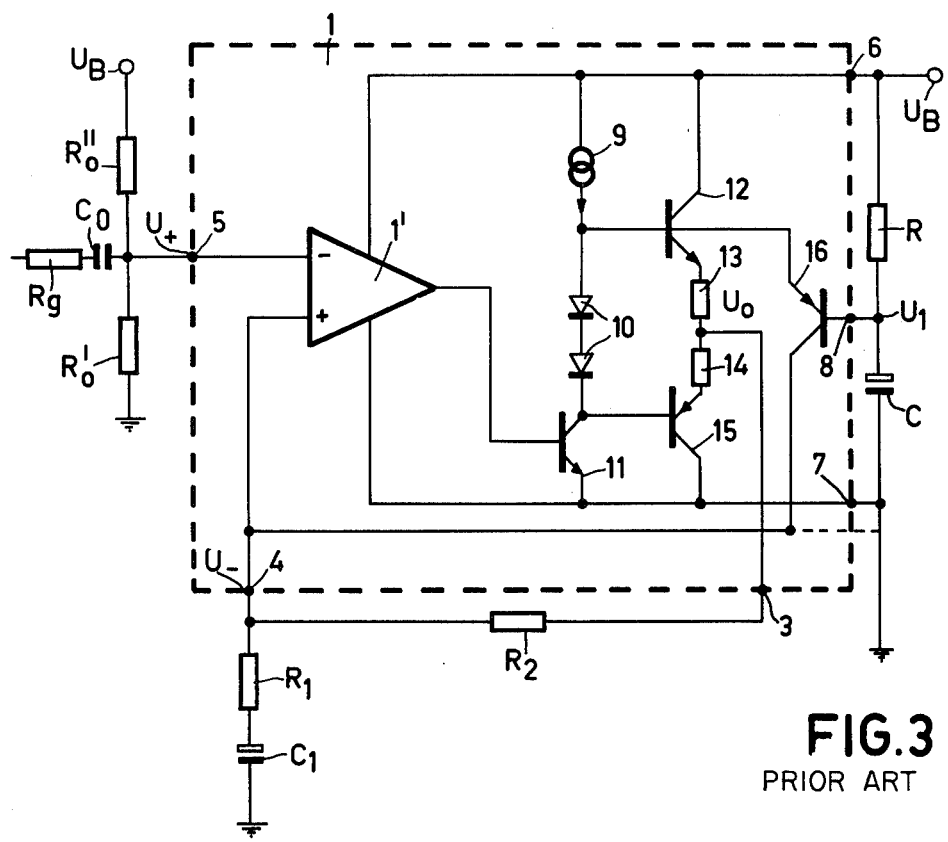
Figure 4A:
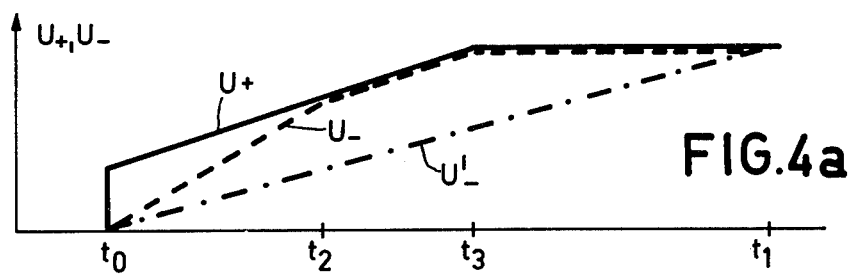
Figure 4B:
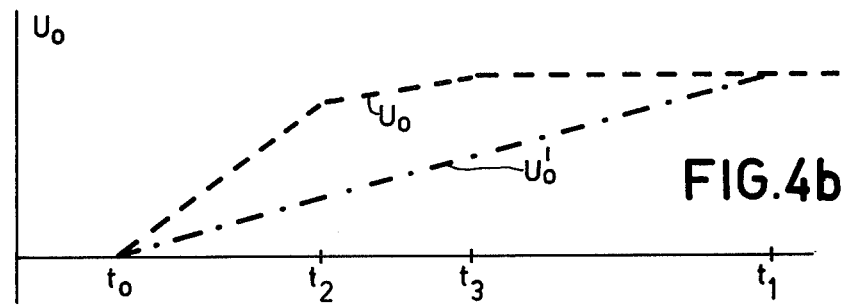

The invention will now be described in more detail with reference to the drawing. In the drawing:

FIG. 1 shows a known amplifier arrangement in order to explain the causes of the voltage transients, FIGS. 2a–2c represents various voltages in the circuit arrangement of FIG. 1 as a function of time, FIG. 3 shows an embodiment of the invention, and FIGS. 4a and 4b show the various voltages in the circuit arrangement of FIG. 3 as a function of time.

The amplifier arrangement shown in FIG. 1 comprises an operational amplifier 1 having an inverting input 4 connected to its output 3 via a resistor $R_2$ and to ground via the series arrangement of a resistor $R_1$ and the capacitor $C_1$. The signal supplied by the signal source 2 is applied to the non-inverting input 5 of the amplifier via a decoupling capacitor $C_0$ and a resistor $R_g$, which may be formed by the internal resistance of the source. The amplifier bias $U_V$ is applied via a resistor $R_0$.

The signal gain is defined by the quotient $R_2/R_1$. The capacitor $C_1$ serves to ensure that the output direct voltage and its variation are fully transferred to the inverting input. The capacitor should be sufficiently large to ensure that no perceptible decrease in gain occurs at the lowest signal frequency to be transferred. Since the resistors $R_2$ and $R_1$ cannot be made arbitrarily small in practice, this results in very high time constants (up to a few seconds) especially at a very high gain and a very low limit frequency (for example, in amplifiers for cassette recorders or pick-ups). In the steady state the direct voltage $U_+$ on a non-inverting input, $U_-$ on the inverting input, and $U_0$ on the output of the amplifier correspond to each other. They are then equal to the bias voltage $U_V$ which is derived directly from the battery voltage.

It is assumed that the battery voltage $U_B$ is switched on at the instant $t=t_0$. Immediately after switching on, the potential $U_+$ on the non-inverting input 5 jumps to the value $U_+ = U_V R_g/(R_0+R_g)$. Initially, the inverting input 4 is at ground potential so that, between the two inputs a comparatively large voltage difference exists, as a result of which the output voltage $U_0$ assumes a maximum value which is substantially equal to the supply voltage $U_B$ (see FIG. 2c). The voltage transient at the output also gives rise to a voltage transient at the inverting input, but this transient is reduced by the factor $R_1/(R_1+R_2)$ in comparison with the voltage transient on the output.

The capacitors $C_0$ and $C_1$ are then charged. If it is assumed that when the power supply is switched on the voltage transient at the non-inverting input is greater than the voltage transient on the inverting input, the output voltage will retain its upper maximum value, the capacitor $C_1$ being charged further. If the RC-networks are then dimensioned so that the voltage at the non-inverting input increases at a rate which is faster than can be followed by the voltage on the inverting input, the voltages $U_{30}$ and $U_-$ on the non-inverting and the inverting amplifier input respectively will vary as schematically represented in FIG. 2b. In this respect it is to be noted that in reality the voltage does not increase as a linear function of time— as is shown in FIG. 2b—but varies in accordance with an exponential function.

The voltage $U_0$ at the output of the amplifier does not return from its maximum value to the steady-state value until the voltage $U_-$ on the inverting input has also reached its steady-state value $U_V$. The voltage transients at the instant $t=0$ and during the transition to the steady-state value (see FIG. 2c) are reproduced as undesired sounds by a loudspeaker connected to the amplifier.

FIG. 3 shows an embodiment of the invention in which the voltage transients are eliminated. The amplifier 1 comprises a pre-amplifier 1', whose output is connected to a driver stage, which in its turn drives a power stage. The driver stage comprises an npn-transistor 11, whose base is connected to the output of the pre-amplifier 1' and whose emitter is connected to ground or (point 7). The collector of the transistor 11 is connected to a d.c. source 9 via two diodes 10 arranged in series and poled in the forward direction. The other terminal of said source is connected to the power-supply terminal 6, which during operation carries the positive voltage $U_B$ (for example, +20 V). The collector of the transistor 11 is connected to the base of a pnp-transistor 15, whose collector is connected to ground and whose emitter is connected to the emitter of an npn-transistor 12 via the series arrangement of two equal resistors 13 and 14. The base of the transistor 12 is connected to the junction point of the d.c. source 9 and the series-connected diodes 10, whereas its collector is connected to the terminal 6. The transistors 12 and 15 constitute a push-pull power stage and the push-pull output 3 is constituted by the junction point of the resistors 13 and 14.

Since the amplified signal is 180° phase-shifted by the driver transistor 11, the inverting input of the preamplifier 1' constitutes the non-inverting input 5 of the amplifier 1 and, similarly, the non-inverting input of the pre-amplifier 1' constitutes the inverting input 4 of the amplifier 1. In the same way as in the amplifier shown in FIG. 1 a negative-feedback resistor $R_2$ (100 kohms) is arranged between the amplifier output 3 and the inverting input 4. The input 4 also is connected to ground via the series arrangement of a resistor $R_1$ (1 kohm) and a capacitor $C_1$ (10 μF). On the non-inverting input 5 a bias voltage is obtained by means of a voltage divider $R_0''$, $R_0'$ (100 kohms each) connected to the supply voltage $U_B$. However, the bias voltage at the non-inverting input can also be obtained in the manner shown in FIG. 1. The non-inverting input 5 is moreover connected to the signal source, not shown, via a coupling capacitor $C_0$ (0.22 μF) and the resistor $R_g$ (5 kohms).

So far the amplifier is in principle known. However, in accordance with the invention, there is provided a pnp transistor 16, which serves as a controllable voltage source, and has its emitter connected to the base of the transistor 12. The base of the transistor 16 is connected to the junction point of a capacitor C, whose other end is connected to ground or to the terminal 7, and resistor R. The other terminal of resistor R is connected to the supply voltage $U_B$ or the terminal 6. The RC-network R, C produces a voltage $U_1$ which increases comparatively slowly and monotonously during the turn-on period. The voltage enables the magnitude of the output voltage of the voltage source, that is the emitter voltage of the transistor 16, to be controlled. The emitter voltage of transistor 16 follows the voltage $U_1$ until the transistor 16 is cut off when its emitter potential becomes more negative than the voltage $U_1$. The collector of the transistor 16 is connected to the inverting input 4 of the amplifier 1. However, as is represented by a broken line, it may alternatively be connected to ground or to an other point of constant potential.

When in the last-mentioned case the supply voltage $U_B$ is switched on (variation of the supply voltage as a function of time as shown in FIG. 2a), this has the following effect: The voltage $U_+$ on the non-inverting input 5 (see the continuous curve $U_+$ in FIG. 4a) is not influenced by the step in accordance with the invention. Consequently, its variation as a function of time is the same as represented in FIG. 2b. However, the voltage source which conducts current in one direction only, that is the transistor 16, causes a different variation of the potential $U_0$ at the output 3 of the amplifier because its low-ohmic output determines the potential on the base of the transistor 12 and drains the current from the d.c. source 9. At the instant of the switch on, the voltage $U_1$ across the capacitor C or on the base of the transistor 16 is zero and the base potential of the transistor 12 is only higher by an amount equal to the base-emitter voltage of the transistor 16. As a result of this, the voltage $U_0$ at the amplifier output 3 is substantially zero at the instant of switching on. During the turn-on period it follows the variation of the voltage $U_1$, so that it also increases continuously and monotonously, as represented in simplified form by the dash-dot curve $U_0'$ in FIG. 4b (in reality the voltage does not increase as a linear function of time, as shown in FIG. 4b, but in accordance with an exponential function). When the RC-network R, C is proportional so that the voltage $U_-$ on the inverting input 4 can follow said voltage substantially without any delay, its variation as a function of time will be equal to that of the output voltage $U_0$ (represented by the dash-dot line $U_-'$ in FIG. 4a). As soon as said voltage has reached the value of the $U_+$ on the voltage non-inverting input 5, which in the meantime has assumed the steady-state value, transistor 11 is turned on.

As a result of this, the potential at the emitter of the transistor 16 is reduced until said transistor is cut off completely. From this instant the voltage source 16 can no longer influence the direct voltage $U_0$ at the output of the amplifier 3. However, initially it may influence the positive signal peaks of a large signal applied to the non-inverting input. However, as soon as the voltage $U_1$ across the capacitor C has reached a value equal to the DC supply voltage $U_B$, or a value which is smaller by an amount equal to the base-emitter voltage of the transistor 16, the transistor 16 is held in cut off.

Briefly summarized this means that the transistor 16 or the voltage source constituted by said transistor, which conducts current in one direction only, is operative only during the turn-on period and is inoperative during steady-state operation.

Although it follows from the foregoing that in this circuit arrangement, in which the collector of the transistor 16 is connected to ground or to a point of constant potential, no voltage transients can occur, this arrangement has the disadvantage that the time constant of the RC-element R, C must be comparatively large to ensure that it can follow the voltage on the inverting input 4 and that the voltage on the output 3 does not reach its steady-state value until at the instant $t_1$ (see FIGS. 4a and 4b) the voltage on the inverting input has reached the value of the voltage on the non-inverting input.

However, the steady-state can be reached in a substantially shorter time if the current drained by the voltage source is used for charging the capacitor $C_1$. This can be achieved in that the collector of the transistor 16 is connected to the inverting input 4 and thus to the series RC-network $R_1$, $C_1$. Capacitor $C_1$ is then charged at a substantially faster rate so that the time constant of the RC-element R, C can be reduced—even to such an extent that already in the turn-on period the voltage $U_0$ reaches the value of the voltage on the non-inverting input. The effect of this change in circuit arrangement will again be apparent from FIGS. 4a and 4b.

Since this step has no influence on the potential on the non-inverting input, the voltage variation on said input will not change (see FIG. 4a, the continuous curve $U_+$). After the turn-on transient at the input 5, the voltage $U_1$ and thus the output voltage $U_0$ (compare dashed-line in FIG. 4b) rises more steeply than the voltage on the non-inverting input, while simultaneously the collector current of the transistor 16 charges the capacitor $C_1$ via the resistor $R_1$. Consequently, the voltage $U_-$ (dashed line in FIG. 4a) also rises faster than the voltage $U_+$, until at the instant $t=t_2$ it has reached the value of the voltage at the non-inverting input. At this instant the transistor 11 is turned on so that the current supplied by transistor 16 in conjunction with the current through the resistor $R_2$ just suffices to allow the voltage across capacitor $C_1$, or on the inverting input 4, to rise exactly as fast as the voltage on the non-inverting input 5. As a result of this, the output voltage then also increases substantially in a similar way to the voltage on the non-inverting input. As soon as the voltage $U_+$ on the non-inverting input 5 has reached its steady-state value (and thus the voltage $U_-$ at instant $t_3$), the output voltage $U_0$ also assumes this value. When capacitor C is charged further, the transistor 16 is cut off so that it can no longer be turned on by large signals on the non-inverting input.

In this embodiment of the invention the steady state is reached substantially faster (at the instant $t_3$) than in the embodiment described in the foregoing (collector of the transistor 16 connected to ground) and without the occurrence of output voltage transients. If, for example, the current of the current source 9 is 200 mA, capacitor $C_1$ (10 $\mu$F) is charged at a rate of at least 10 V/s, so that the steady state (10 V on the inverting input) is reached in exactly 500 ms. However, if the collector current of the transistor 16 were drained to ground, this would require a time of some seconds. Therefore, the circuit arrangement is suitably so designed that the voltage across the capacitor reaches the steady-state value (10 V) when the voltages $U_-$ and $U_+$ have become equal to each other.

In the embodiment shown in FIG. 3 the power supply voltage $U_B$, and thus the output voltage $U_0$ of the amplifier, has a positive polarity. As a result, the voltage source should then be formed by a pnp transistor 16. If, instead of this, transistors 11, 12 and 15 would be of the opposite conductivity type, so that a negative supply voltage would be required and the output voltage $U_0$ would be negative, the voltage source would have to be constituted by an npn transistor because such a transistor conducts initially and is subsequently turned off.

For an even faster variation of the voltage $U_-$ in the turn-on period the current supplied by the voltage source 16 must be increased. This may for example be achieved in that between the emitter of the transistor 16 and the power supply $U_B$ a further resistor or a further current source is included. In order to prevent said resistor or said current source from influencing the amplifier in the steady state, a diode which is cut off in the steady state (cathode connected to the emitter of transistor 16) should be arranged between the base of the transistor 12 and the emitter of the transistor 16.

Although the circuit arrangement in the foregoing has been described in conjunction with an amplifier with d.c. negative feedback, in which the direct voltage transients during turn-on arise because the voltage on the inverting input cannot follow the voltage on the non-inverting input, the invention may also be applied to those amplifiers in which the direct voltage transient have other causes, for example in amplifiers in which the supply voltage is applied via an RC-network which is gradually charged during switching on and whose amplifier output voltage varies irregularly with the supply voltage.

What is claimed is:

1. An amplifier capable of eliminating direct voltage transients at the amplifier output when the amplifier power supply is switched on comprising, a voltage source coupled to a point in the amplifier such that the amplifier output direct voltage gradually increases to a steady-state value during the turn-on period, characterized in that the voltage source conducts current in one direction only, means for applying a control voltage which varies continuously during the turn-on period to a control input of the voltage source thereby to control the magnitude of the output voltage of the voltage source, and means connecting the voltage source to the amplifier such that the voltage source is cut off by a potential change produced as the amplifier output voltage increases.

2. An amplifier as claimed in claim 1, which comprises a power stage and a drive stage preceding the power stage, and wherein said connecting means couples the voltage source to the driver stage such that a drive current is at least partly drained via said voltage source.

3. An amplifier as claimed in claim 1 wherein the amplifier includes a negative feedback loop and the voltage source comprises at least one transistor having a base electrode that receives the control voltage, and means connecting a collector of said one transistor to a point in the negative-feedback loop of the amplifier.

4. An amplifier as claimed in any one of claims 1, 2 or 3 wherein the control voltage is produced by a series RC-network connected to terminals of the power-supply.

5. An amplifier as claimed in claim 2 further comprising a d.c. negative feedback loop coupling the amplifier output to an inverting input of the amplifier, means connecting the amplifier inverting input via an RC-network to a point of constant potential, characterized in that the current drained via the voltage source is applied to the RC network such that the steady-state value of the output voltage is reached faster by more rapidly charging the capacitor of the RC network.

6. An amplifier as claimed in claim 5 wherein the voltage source includes at least one transistor with a collector of the transistor connected to the amplifier inverting input.

7. An amplifier as claimed in claim 2 wherein the amplifier includes a negative feedback loop coupled between an amplifier output terminal and an amplifier input terminal, and said voltage source comprises a transistor having a base electrode forming said control input and a collector coupled to a circuit point in the amplifier negative feedback loop.

8. An amplifier as claimed in claim 1 wherein said amplifier includes an inverting input and a non-inverting input, a DC negative feedback loop coupling the amplifier output to the amplifier inverting input, an RC network coupling said amplifier inverting input to a source of constant voltage, means coupling an output of the voltage source to the RC network so that the voltage source supplies a charge current to the capacitor of said RC network during the turn-on period thereby to reduce the charging period of the capacitor so as to reduce the time period required to achieve a steady-state value of the output voltage, and means coupling the amplifier non-inverting input to a signal input terminal of the amplifier.

9. An amplifier as claimed in claim 3 wherein said amplifier includes an inverting input and said negative feedback loop is coupled between the amplifier output and the amplifier inverting input, and wherein said collector connecting means connects the collector of the transistor to the amplifier inverting input.

10. An amplifier as claimed in claim 1 wherein said point in the amplifier to which the voltage source is coupled is the amplifier output.

11. An amplifier capable of suppressing direct voltage transients at an output of the amplifier during the turn-on period of the amplifier DC power supply comprising, amplifier input means and a negative feedback circuit coupling the amplifier output to the amplifier input means, a signal input terminal coupled to the amplifier input means, a controllable voltage source including a transistor having first and second input terminals for controlling the transistor current flow and an output terminal, means for supplying a control voltage to the second input terminal of the transistor which varies gradually in amplitude during the turn-on period thereby to vary the magnitude of an output voltage of the controllable voltage source during said turn-on period, means for coupling said transistor output terminal to a circuit point in the amplifier thereby to cause the output direct voltage at the amplifier output to gradually increase in amplitude during the turn-on period until it reaches a steady-state value, and means connecting said first input terminal of the transistor to the amplifier such that the controllable voltage source is cut-off by a potential change produced in the amplifier as the amplifier output voltage increases during said turn-on period.

12. An amplifier as claimed in claim 11 wherein said coupling means couples the transistor output terminal to a circuit point in the negative feedback circuit.

13. An amplifier as claimed in claim 11 wherein said control voltage supplying means comprises an RC network including a resistor and capacitor connected in series to a power supply terminal of the amplifier and with the capacitor coupled to said second input terminal of the transistor.

14. An amplifier as claimed in claim 11 wherein said amplifier input means includes a non-inverting input terminal coupled to the signal input terminal and an inverting input terminal coupled to the amplifier output via said negative feedback circuit, an RC network coupling said inverting input terminal to a source of constant voltage, and wherein said coupling means couples the transistor output terminal to said RC network thereby to supply a current to said RC network during the turn-on period so as to more rapidly charge the capacitor of the RC network and thereby reduce the time duration of the turn-on period.

15. An amplifier as claimed in claim 11 wherein said amplifier input means includes a non-inverting input terminal coupled to the signal input terminal and an inverting input terminal coupled to the amplifier output via said negative feedback circuit, an RC network coupling said inverting input terminal to a source of constant voltage, and wherein said coupling means couples the transitor output terminal to said source of constant voltage.

16. An amplifier as claimed in claim 11 wherein said connecting means connects the first input terminal of the transistor to a circuit point in the amplifier whose voltage varies in conformance with the change of amplifier output voltage during the turn-on period.

17. An amplifier as claimed in claim 11 wherein said amplifier input means includes a non-inverting input terminal coupled to the signal input terminal and an inverting input terminal coupled to the amplifier output via said negative feedback circuit, wherein the amplifier includes a preamplifier having an inverting input coupled to said amplifier non-inverting input terminal and a non-inverting input coupled to said amplifier inverting input terminal, a second transistor connected in series with a DC current source to a power supply terminal of the amplifier and having a control input coupled to an output of said preamplifier, an output transistor having a control electrode coupled to an output terminal of the second transistor and an output electrode coupled to said amplifier output, a first RC network coupling the amplifier inverting input terminal to a source of reference voltage, a second RC network coupled to said power supply terminal and to said second input terminal of the first transistor for supplying said control voltage thereto, and wherein said coupling means couples the first transistor output terminal to the amplifier inverting input terminal and the connecting means connects the first transistor first input terminal to said DC current source.

18. An amplifier as claimed in claim 14 wherein said amplifier includes a drive transistor connected in series with a DC current source to a power supply terminal of the amplifier and said connecting means connects the first input terminal of the transistor to a junction point between the DC current source and the drive transistor, said drive transistor being controlled into a cut-off state at least during a first part of the turn-on period, and said amplifier further comprising a resistor connecting said first input terminal of the transistor to said amplifier power supply terminal.

19. An amplifier as claimed in claim 11 wherein said connecting means couples the first input terminal of the transistor to the amplifier output and said coupling means couples the transistor output terminal to a circuit point in the negative feedback circuit.

* * * * *

UNITED STATES PATENT AND TRADEMARK OFFICE
CERTIFICATE OF CORRECTION

PATENT NO. : 4,462,000
DATED : July 24, 1984
INVENTOR(S) : DETLEF GOTTLIEB ET AL It is certified that error appears in the above-identified patent and that said Letters Patent is hereby corrected as shown below:

In the Drawings:

Figure 3, please cancel "PRIOR ART"

Signed and Sealed this

Fourth Day of March 1986

[SEAL]

Attest:

Attesting Officer

DONALD J. QUIGG

Commissioner of Patents and Trademarks